(12) United States Patent
Gentile

(10) Patent No.: US 6,621,366 B1
(45) Date of Patent: Sep. 16, 2003

(54) PARALLEL-PROCESS DIGITAL MODULATOR STRUCTURES AND METHODS

(75) Inventor: Ken Gentile, Bahama, NC (US)

(73) Assignee: Analog Devices, Inc., Norwood, MA (US)

( * ) Notice: Subject to any disclaimer, the term of this patent is extended or adjusted under 35 U.S.C. 154(b) by 152 days.

(21) Appl. No.: 10/013,131

(22) Filed: Dec. 7, 2001

(51) Int. Cl.[7] .............................................. H03C 3/00
(52) U.S. Cl. ........................ 332/103; 332/104; 375/302
(58) Field of Search ................................ 332/103, 104, 332/105; 375/302, 303, 304, 305, 306, 307, 308; 327/233, 238, 254

(56) References Cited

U.S. PATENT DOCUMENTS

| | | | |
|---|---|---|---|
| 5,638,401 A | * | 6/1997 | Jones ......................... 375/298 |
| 5,781,076 A | | 7/1998 | Iwamatsu et al. |
| 6,240,142 B1 | * | 5/2001 | Kaufman et al. ............ 375/261 |
| 6,384,677 B2 | * | 5/2002 | Yamamoto ................... 330/10 |

* cited by examiner

*Primary Examiner*—Henry Choe
(74) *Attorney, Agent, or Firm*—Koppel, Jacobs, Patrick & Heybl

(57) ABSTRACT

In order to generate a carrier frequency $F_c$, a digital modulator must operate (to satisfy the Nyquist criteria) at a system sample rate $R_s$ which is at least twice the carrier frequency $F_c$. However, digital modulator structures are provided herein that facilitate the use of M quadrature modulators which modulate, at a reduced modulation rate $R_s/M$, respective ones of M polyphase cosine elements and M polyphase sine elements with respective ones of interpolated I elements and interpolated Q elements to thereby form M polyphase modulated elements. The modulated elements are then sequentially selected in a multiplexer to form a modulated digital signal. The reduced modulation rate simplifies modulator design and lowers fabrication costs.

30 Claims, 4 Drawing Sheets

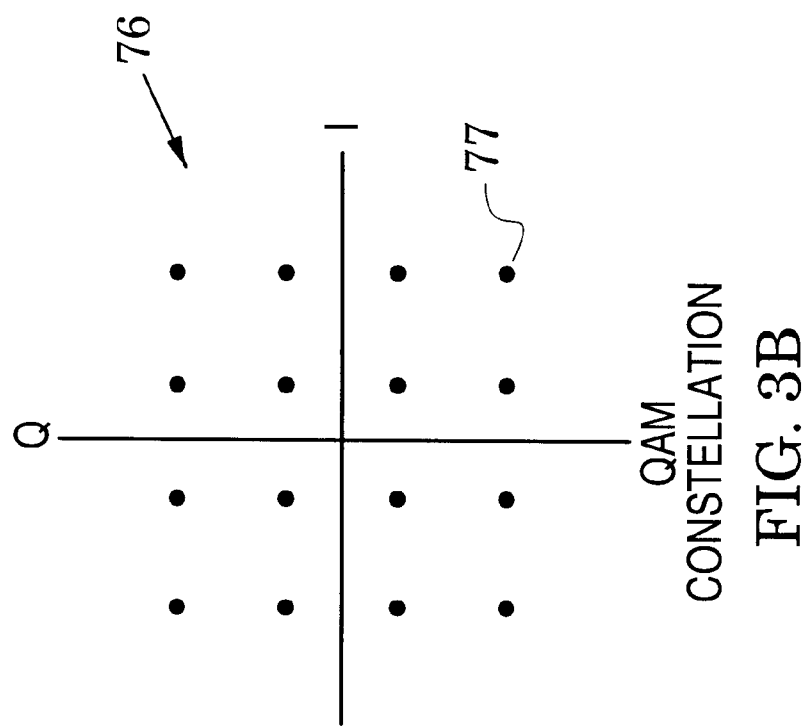
FIG. 3B QAM CONSTELLATION
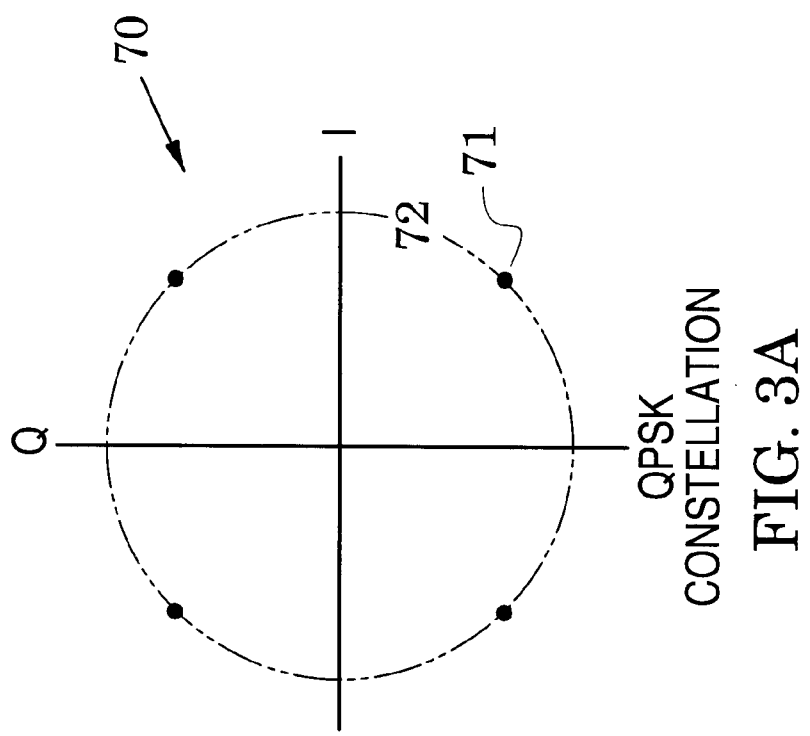
FIG. 3A QPSK CONSTELLATION

PARALLEL-PROCESS DIGITAL MODULATOR STRUCTURES AND METHODS

BACKGROUND OF THE INVENTION

1. Field of the Invention

The present invention relates generally to digital modulator systems.

2. Description of the Related Art

Digital modulators find use in a variety of modern communication systems. Cable modems, for example, employ digital modulators to provide high-speed Internet service over bidirectional transmission systems (e.g., coaxial cables and optical fibers). Downstream data has typically been processed with quadrature amplitude modulation (QAM). Although quadrature phase-shift keying (QPSK) is a typical upstream modulation process, other processes (e.g., QAM) are often used to enhance the efficiency (bits/Hz) of the upstream data path. Cable modems have typically operated with an upstream data rate (e.g., 10 Mb/s) in an upstream communications band (e.g., 5–42 MHz) and with a higher downstream data rate (e.g., 36 Mb/s) in a different downstream communications band (e.g., 42–850 MHz).

Realizing digital modulators with extremely high carrier frequencies $F_c$ is challenging because the Nyquist criteria requires that the system sampling rate $R_s$ be at least twice the carrier frequency $F_c$. For a carrier frequency in the region of 500 MHz, a modem's quadrature modulator must therefore operate at a system rate $R_s$ of 1 GHz. Design of a 1 GHz modulator generally requires extensive pipelining of the modulator's adders and multipliers with consequent increase of modulator costs.

BRIEF SUMMARY OF THE INVENTION

The present invention is directed to digital modulator structures and methods that can operate at extended system rates $R_s$ and thus realize high carrier frequencies $F_c$.

These goals are realized with modulator structures and methods that facilitate the use of M quadrature modulators which modulate, at a reduced modulation rate $R_s/M$, respective ones of M polyphase cosine elements and M polyphase sine elements with respective ones of interpolated I elements and interpolated Q elements to thereby form M polyphase modulated elements.

Modulator embodiments of the invention are thus significantly easier to realize for a high carrier frequencies $F_c$ and their structure can be substantially simplified.

The novel features of the invention are set forth with particularity in the appended claims. The invention will be best understood from the following description when read in conjunction with the accompanying drawings.

BRIEF DESCRIPTION OF THE DRAWINGS

FIGS. 3A and 3B are diagrams of modulation constellations in embodiments of an encoder of the digital modulator of FIG. 1.

DETAILED DESCRIPTION OF THE INVENTION

Figure 1:
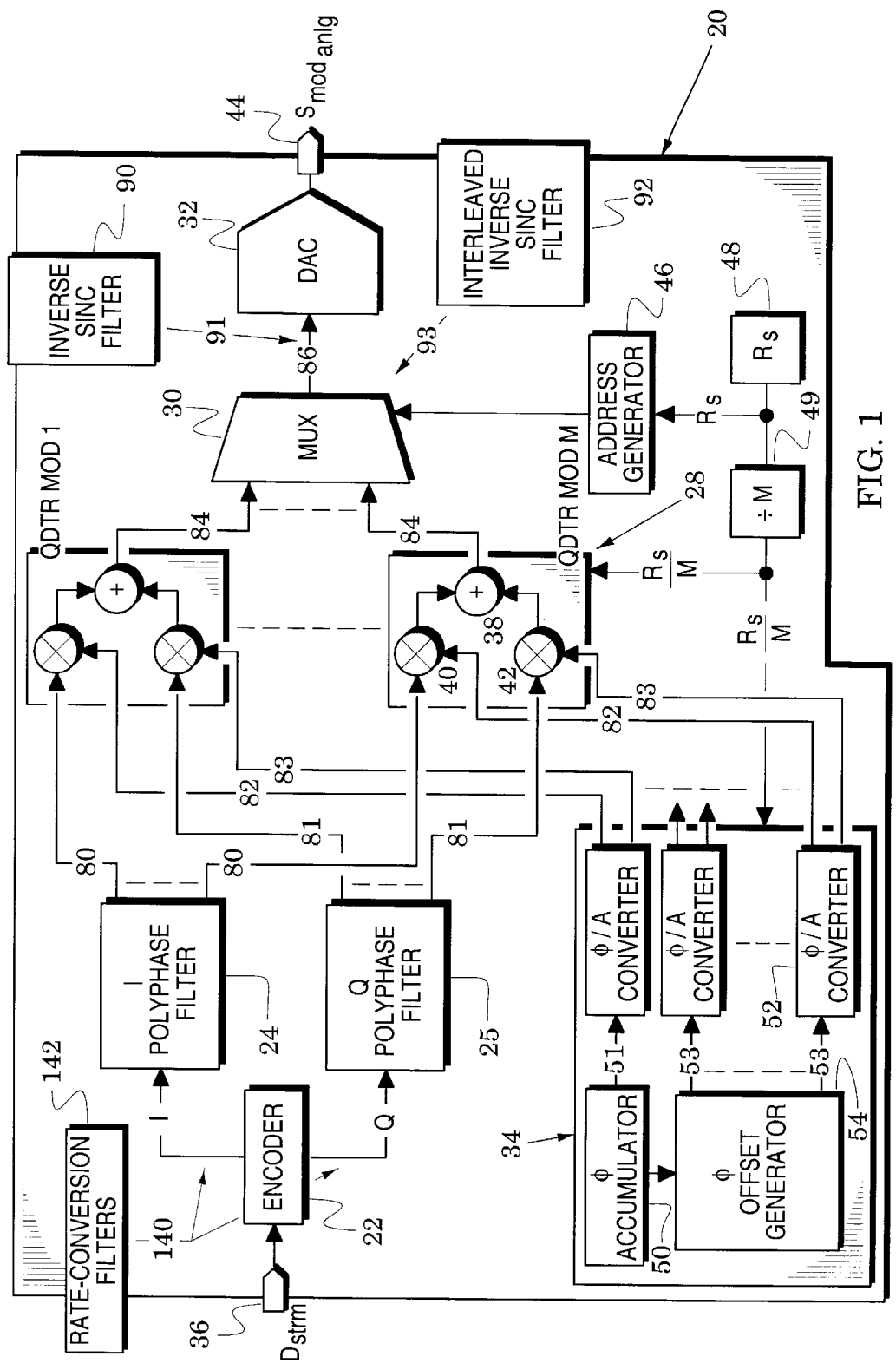
FIG. 1 is a block diagram of a digital modulator embodiment of the present invention.

FIG. 1 illustrates a digital modulator embodiment 20 of the current invention. Although a digital modulator that generates a carrier frequency $F_c$ must operate at a system sample rate $R_s$ which is at least twice the carrier frequency $F_c$ (to satisfy the Nyquist criteria), the structure of the modulator 20 facilitates the use of quadrature modulators which operate at a reduced rate $R_s/M$. Accordingly, digital modulator embodiments of the invention are significantly easier to realize for a selected carrier frequency $F_c$ and their structure is significantly simplified.

In particular, the digital modulator embodiment 20 of FIG. 1 includes an encoder 22, an I polyphase filter 24 and a Q polyphase filter 25, M quadrature modulators 28, a multiplexer 30, a digital-to-analog converter (DAC) 32 and a digital synthesizer 34. The encoder 22 is coupled between the I and Q polyphase filters 24 and 25 and an input data port 36 and receives a data stream $D_{strm}$ from the port 36.

Each of the M quadrature modulators 28 has a summer 38 and an I multiplier 40 that is coupled between the summer and a respective output of the I polyphase filter 24. Each of the quadrature modulators also has a Q multiplier 42 that is coupled between its summer and a respective output of the Q polyphase filter 25. The DAC 32 delivers a modulated analog signal $S_{mod_{anlg}}$ to an output port 44 and the multiplexer 30 is coupled between the DAC and the M quadrature modulators 28.

The multiplexer 30 responds to an address generator 46 at a system rate $R_s$ which is supplied by a rate (clock) generator 48. A divide-by-M divider 49 responds to the rate generator and supplies a reduced rate $R_s/M$ to the M quadrature modulators 28 and the digital synthesizer 34.

An operational description of the digital modulator 20 is enhanced by preceding it with the following investigation of the digital synthesizer 34. As shown in FIG. 1, this synthesizer includes a phase ($\phi$) accumulator 50 which is coupled to a phase offset generator 54 and also includes M phase-to-amplitude ($\phi$/A) generators 52. One of the $\phi$/A generators 52 is driven by the phase accumulator 50 and M−1 of the $\phi$/A generators 52 are driven by the phase offset generator 54.

The phase accumulator 50 is an N-bit accumulator that generates a primary periodic stream 51 of digital words at the reduced rate $R_s/M$ that is supplied by the divider 49. The phase accumulator 50 counts modulo $M\phi_s$ wherein $\phi_s$ is a programmable phase step and the accumulator has a capacity of $C=2^N$ so that the primary periodic stream of words repeats at an accumulator frequency of $f_{acmltr}=(\phi_s R_s)/C$.

The phase offset generator 54 offsets each word of the primary stream by $\phi_s, 2\phi_s, \text{-- -- --} (M-1)\phi_s$ to thereby provide M−1 secondary streams 53 in which each word in the primary stream has corresponding words in the secondary streams that are progressively offset by $\phi_s, 2\phi_s \text{-- -- --} (M-1)\phi_s$.

The primary and secondary word streams are applied to the $\phi$/A converters 54 which convert them to words that represent respective amplitudes in a quantized cosine signal and a quantized sine signal. Therefore, at the reduced rate of $R_s/M$, the digital synthesizer 34 provides M polyphase cosine elements of a quantized cosine signal and M polyphase sine elements of a quantized sine signal to the quadrature modulators 28.

Figure 2:
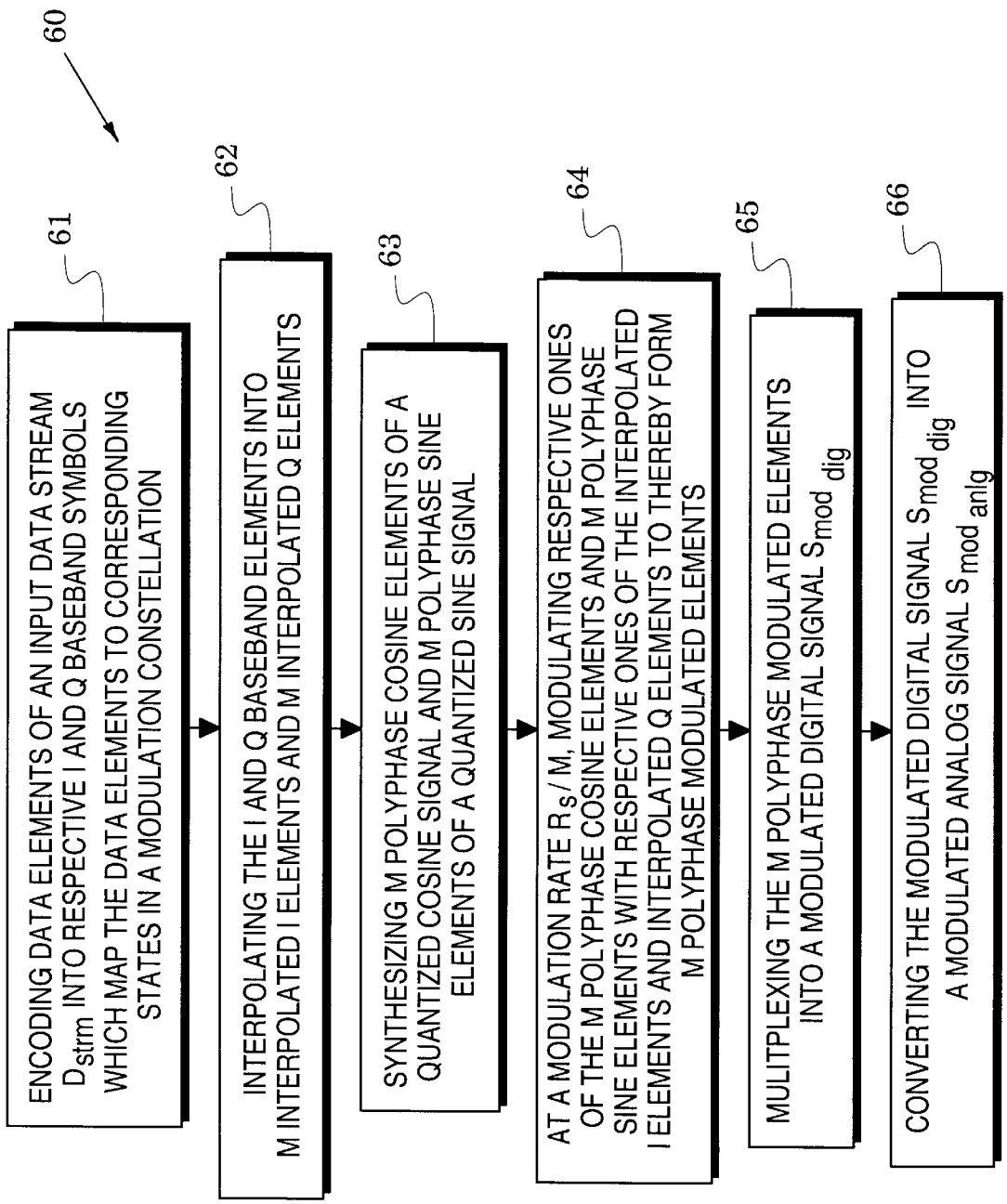
FIG. 2 is a flow chart that recites exemplary process steps in the digital modulator of FIG. 1.

Attention is now directed to the flow chart 60 of FIG. 2 which illustrates operational processes of the digital modulator 20 of FIG. 1. In a first process step 61, an encoder (22 in FIG. 1) encodes data elements of the input data stream $D_{strm}$ into respective I and Q baseband symbols (indicated as I and Q at the outputs of the encoder 22 in FIG. 1) which map the data elements to corresponding states in a selected modulation constellation.

The selected modulation constellation can be any of various quadrature modulations, e.g., quadrature phase shift keying (QPSK), offset QPSK, $\pi/4$ QPSK, M-ary PSK and quadrature amplitude modulation (QAM). For example, FIGS. 3A and 3B respectively show a $\pi/4$ QPSK modulation constellation and a 16-state QAM constellation. The constellation 70 of FIG. 3A has four states 71 that lie on a common circle 72 and are rotated 45° from the I/Q axes. The modulation of FIG. 3A can represent 2 bits of data ($2^2=4$) and, because the states 71 are equidistant from the constellation center, it generates a constant-amplitude modulated signal.

In contrast, the constellation 76 of FIG. 3B has 16 states 77 that are spaced apart by equal distances along the I and Q axes. The modulation of FIG. 3B can represent 4 bits of data ($2^4=16$) and, because the states 77 have different distances from the constellation center, it generates a modulated signal whose amplitude is not constant. Many other quadrature modulation constellations are well known and may be practiced with the structure and method embodiments of the invention.

Process step 62 of FIG. 2 describes operation of an M-branch I polyphase filter (24 in FIG. 1) which interpolates the I baseband symbols into M interpolated I elements (which are indicated as 80 in FIG. 1) and an M-stage Q polyphase filter (25 in FIG. 1) which interpolates the Q baseband symbols into M interpolated Q elements (which are indicated as 81 in FIG. 1). If M=8, for example, the filters 24 and 25 would be finite impulse response (FIR) filters whose sequence of filter coefficients is partitioned into 8 subsequences (one on each filter branch) which are generally referred to as the polyphase components of the original sequence.

Polyphase filters are rate-conversion filters that interpolate an input stream of elements. When the polyphase components are multiplexed at the filter output, the input sample rate is increased by the number of polyphase components. In the M-branch I and Q polyphase filters of FIG. 1, however, the interpolated elements are not combined at the filter outputs but, rather, are provided to respective quadrature modulators 28. Thus, the interpolated elements 80 and 81 in FIG. 1 are delivered in parallel to the quadrature modulators.

Process step 63 summarizes the previously-described operation of the digital synthesizer 34 of FIG. 1. In particular, this process step refers to a digital synthesizer that repeatably provides M polyphase cosine elements (shown as 82 in FIG. 1) of a quantized cosine signal and M polyphase sine elements (shown as 83 in FIG. 1) of a quantized sine signal.

In process step 64, the M quadrature modulators (28 in FIG. 1) modulate, at the reduced rate $R_s/M$, respective ones of the M polyphase cosine elements and the M polyphase sine elements with respective ones of the interpolated I elements and the interpolated Q elements to thereby form M polyphase modulated elements that are indicated as 84 in FIG. 1.

In process step 65, the multiplexer (30 in FIG. 1) multiplexes (i.e., sequentially selects) the polyphase modulated elements (84 in FIG. 1) into a modulated digital signal $S_{mod_{dig}}$ that is indicated as 86 in FIG. 1. Finally, the digital-to-analog converter 32 of FIG. 1 converts, as recited in process step 66, the modulated digital signal $S_{mod_{dig}}$ into a modulated analog signal $S_{mod_{anlg}}$ at the digital modulator's output port (44 in FIG. 1).

In another digital modulator embodiment, a digital inverse sinc filter 90 is inserted between the mulitplexer 30 and the DAC 32 as indicated by insertion arrow 91 in FIG. 1. By imposing an x/sin x response on the modulated digital signal 86, this filter compensates the inherent sin x/x (sinc) rolloff which is necessarily generated by the sampling process of the DAC 32.

In another digital modulator embodiment, the sequential selection function of the multiplexer 30 can be replaced with a multi-input DAC which would replace the multiplexer 30 and the single-input DAC 32 of FIG. 1. The multi-input DAC is preferably configured to simultaneously process its multiple input signals and form the modulated analog signal $S_{mod_{anlg}}$ by sequentially ordering the processed signals.

Another digital modulator embodiment is formed by replacing the multiplexer 30 (and the inserted inverse sinc filter 32) with an interleaved inverse sinc filter 92 as indicated by replacement arrow 93 in FIG. 1. The filter 92 is formed with M components that each process the M polyphase modulated elements 84 in a respective order that realizes a respective convolution of the modulated elements and the filter's impulse response coefficients. The interleaved filter 92 includes a multiplexer that sequentially selects the convolution products.

Figure 4:
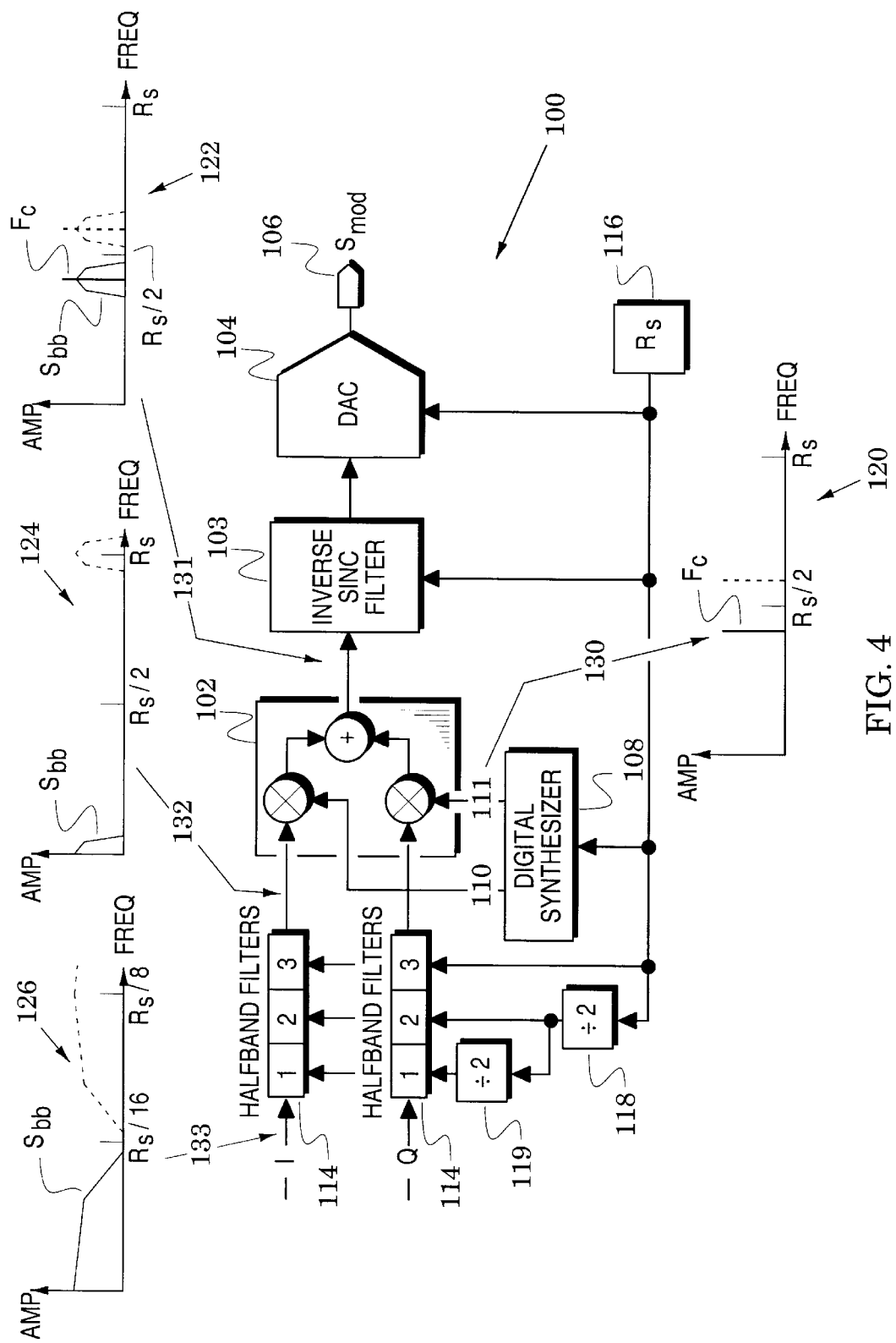
FIG. 4 is a block diagram of a digital modulator that illustrates advantages of modulator embodiments of the present invention.

FIG. 4 illustrates a digital modulator 100 which processes the I and Q baseband symbols of FIG. 1 with a single quadrature modulator 102 that is followed by an inverse sinc filter 103 and a DAC 104 to provide a modulated analog signal $S_{mod_{anlg}}$ at an output port 106. A digital synthesizer 108 provides quantized cosine and sine signals 110 and 111 to the multipliers of the quadrature modulator 102. The I and Q baseband symbols are initially processed through three rate-conversion filters 114. Preferably, these filters are polyphase filters (typically referred to as halfband filters) that each have two polyphase components and realize an interpolation increase of two in the process sample rate.

A rate (clock) generator 116 is directly coupled to the DAC 104, the inverse sinc filter 103, the digital synthesizer 108 and the final pair of halfband filters. A divide-by-two divider 118 couples the rate generator 116 to the middle pair of halfband filters and a final divide-by-two divider 119 couples the rate generator 116 to the initial pair of halfband filters.

A frequency response diagram 120 indicates (with indication arrow 130) a selected carrier frequency $F_c$ that is generated by the quadrature output signals 110 and 111 of the digital synthesizer. Given that carrier frequency selection, another frequency response diagram 122 indicates (with indication arrow 131) the selected carrier frequency $F_c$ with baseband signals $S_{bb}$ that are mirrored about the carrier by the modulation process of the quadrature modulator 102.

The Nyquist criteria requires that a signal having an upper band limit must be sampled at a rate equal to or greater than that limit. Accordingly, the system (sample) rate $R_s$ of the rate generator 116 is selected as shown in the diagram 122 so that $R_s/2$ is above the carrier and its mirrored baseband signals. The carrier and its baseband signals will also be mirrored about the system rate $R_s$ and the lower of these mirrored signals is indicated in broken lines spaced just to the right of $R_s/2$. The frequency range below $R_s/2$ is typically referred to as the first Nyquist zone and the Nyquist criteria requires that the carrier and its mirrored baseband signals be completely within the first Nyquist zone (as in FIG. 4).

Another frequency response diagram 124 indicates (with indication arrow 132) the relationship (at the output of the rate-conversion filters 114) between the baseband signals $S_{bb}$, the selected system rate $R_s$ and the consequent $R_s/2$ location. Note that the baseband signals $S_{bb}$ are mirrored about the system rate $R_s$ as shown in broken lines. Because the three halfband filters 114 increase the sample rate by a factor of 8, the sample rate at the input of the filters is $R_s/8$. Accordingly, another frequency response diagram 126 indicates (with indication arrow 133) the relationship (at the input of the rate-conversion filters 114) between the baseband signals $S_{bb}$, the reduced sample rate $R_s/8$ and one half of this rate which is $R_s/16$. As indicated in broken lines, the baseband signals are mirrored about the reduced sample rate $R_s/8$.

FIG. 4 shows that a selected carrier frequency $F_c$ requires that the quadrature modulator 102 operate at a system rate $R_s$ that is at least twice the carrier frequency $F_c$. If, for example, the selected carrier frequency $F_c$ is 500 MHz, the quadrature modulator must process signals at a rate not less than 1 GHz. As previously mentioned, it is quite difficult to realize a quadrature modulator that can operate at 1 GHz and if such a modulator is realized, it typically requires extensive pipeplined structures. Because the M quadrature modulators 28 of FIG. 1 operate at a rate of $R_s/M$, their realization is significantly easier and their structure is significantly simplified. Accordingly, the operation range of digital modulator embodiments of the invention is substantially enhanced.

It is noted that the data stream $D_{strm}$ at the input port 36 of FIG. 1 may also be processed through rate-conversion filters to thereby lower the input sample rate. This is accomplished by inserting (shown by insertion arrow 140) rate-conversion filters 142 (e.g., polyphase, halfband and cascaded integrator-comb) between the encoder 22 and the I and Q polyphase filters 24 and 25.

The embodiments of the invention described herein are exemplary and numerous modifications, variations and rearrangements can be readily envisioned to achieve an equivalent result, all of which are intended to be embraced within the scope of the appended claims.

I claim:

1. A digital modulator that generates, at a system rate $R_s$ and in accordance with a modulation constellation, a modulated analog signal $S_{mod_{anlg}}$ from an input data stream $D_{strm}$, the system comprising:

an encoder that encodes data elements of said input data stream $D_{strm}$ into respective I and Q baseband symbols which map said data elements to corresponding states in said modulation constellation;

an M-stage I polyphase filter that interpolates said I baseband symbols into M interpolated I elements;

an M-stage Q polyphase filter that interpolates said Q baseband symbols into M interpolated Q elements;

a digital synthesizer that repeatably provides M polyphase cosine elements of a quantized cosine signal and M polyphase sine elements of a quantized sine signal;

M quadrature modulators that modulate, at a modulation rate $R_s/M$, respective ones of said M polyphase cosine elements and said M polyphase sine elements with respective ones of said interpolated I elements and said interpolated Q elements to thereby form M polyphase modulated elements; and a digital-to-analog converter that converts said M polyphase modulated elements into said modulated analog signal $S_{mod_{anlg}}$.

2. The modulator of claim 1, further including at least one first rate-conversion filter that couples said encoder to said I polyphase filter and at least one second rate-conversion filter that couples said encoder to said Q polyphase filter to thereby reduce the rate of said data elements.

3. The modulator of claim 2, wherein said first and second rate-conversion filters are polyphase filters.

4. The modulator of claim 1, wherein said encoder is configured as a quadrature phase shift keying encoder.

5. The modulator of claim 1, wherein said encoder is configured as a quadrature amplitude modulator encoder.

6. The modulator of claim 1, wherein said synthesizer includes:

a phase accumulator that generates a primary substream of digital words;

M−1 phase offset generators that offset said primary substream to thereby generate M−1 secondary substreams of digital words; and M phase-to-amplitude converters that convert respective digital words of said primary and secondary substreams to respective ones of said polyphase cosine elements and said polyphase sine elements.

7. The modulator of claim 1, wherein each of said quadrature modulators includes:

an I multiplier that multiplies interpolated I elements and cosine elements;

a Q multiplier that multiplies interpolated Q elements and sine elements; and a summer that sums products of said I and Q multipliers.

8. The modulator of claim 1, wherein said digital-to-analog converter is configured to process M polyphase modulated elements.

9. The modulator of claim 1, further including a multiplexer that couples said M quadrature modulators to said digital-to-analog converter and that sequentially selects said polyphase modulated elements to form an output stream of modulated elements and wherein said digital-to-analog converter is configured to process said output stream into said modulated analog signal $S_{mod_{anlg}}$.

10. The modulator of claim 1, further including an interleaved inverse sinc filter that couples said M quadrature modulators to said digital-to-analog converter and that multiplexes said polyphase modulated elements into an output stream of modulated elements and wherein said digital-to-analog converter is configured to process said output stream into said modulated analog signal $S_{mod_{anlg}}$.

11. The modulator of claim 1, wherein M is 2.

12. A digital modulator that generates a modulated analog signal $S_{mod_{anlg}}$ at a system rate $R_s$ from I and Q baseband symbols which map data elements of an input data stream to corresponding states in a modulation constellation, the system comprising:

an M-stage I polyphase filter that interpolates said I baseband symbols into M interpolated I elements;

an M-stage Q polyphase filter that interpolates said Q baseband symbols into M interpolated Q elements;

a digital synthesizer that repeatably provides M polyphase cosine elements of a quantized cosine signal and M polyphase sine elements of a quantized sine signal;

M quadrature modulators that modulate, at a modulation rate $R_s/M$, respective ones of said M polyphase cosine elements and said M polyphase sine elements with respective ones of said interpolated I elements and said interpolated Q elements to thereby form M polyphase modulated elements; and a digital-to-analog converter that converts said M polyphase modulated elements into said modulated analog signal $S_{mod_{anlg}}$.

13. The modulator of claim 12, further including at least one first rate-conversion filter that precedes said I polyphase filter and at least one second rate-conversion filter that precedes said Q polyphase filter to thereby reduce the rate of said data elements.

14. The modulator of claim 12, wherein said first and second rate-conversion filters are polyphase filters.

15. The modulator of claim 12, wherein said synthesizer includes:
- a phase accumulator that generates a primary substream of digital words;
- M−1 phase offset generators that offset said primary substream to thereby generate M−1 secondary substreams of digital words; and
- M phase-to-amplitude converters that convert respective digital words of said primary and secondary substreams to respective ones of said polyphase cosine elements and said polyphase sine elements.

16. The modulator of claim 12, wherein each of said quadrature modulators includes:
- an I multiplier that multiplies interpolated I elements and cosine elements;
- a Q multiplier that multiplies interpolated Q elements and sine elements; and
- a summer that sums products of said I and Q multipliers.

17. The modulator of claim 12, wherein said digital-to-analog converter is configured to process M polyphase modulated elements.

18. The modulator of claim 12, further including a multiplexer that couples said M quadrature modulators to said digital-to-analog converter and that sequentially selects said polyphase modulated elements to form an output stream of modulated elements and wherein said digital-to-analog converter is configured to process said output stream into said modulated analog signal $S_{mod_{anlg}}$.

19. The modulator of claim 12, further including an interleaved inverse sinc filter that couples said M quadrature modulators to said digital-to-analog converter and that multiplexes said polyphase modulated elements into an output stream of modulated elements and wherein said digital-to-analog converter is configured to process said output stream into said modulated analog signal $S_{mod_{anlg}}$.

20. The modulator of claim 12, wherein M is 2.

21. A digital modulator that generates M polyphase modulated elements at a system rate $R_s$ from I and Q baseband symbols which map data elements of an input data stream to corresponding states in a modulation constellation, the system comprising:
- an M-stage I polyphase filter that interpolates said I baseband symbols into M interpolated I elements;
- an M-stage Q polyphase filter that interpolates said Q baseband symbols into M interpolated Q elements;
- a digital synthesizer that repeatably provides M polyphase cosine elements of a quantized cosine signal and M polyphase sine elements of a quantized sine signal; and
- M quadrature modulators that modulate, at a modulation rate $R_s/M$, respective ones of said M polyphase cosine elements and said M polyphase sine elements with respective ones of said interpolated I elements and said interpolated Q elements to thereby form M polyphase modulated elements.

22. The modulator of claim 21, further including at least one first rate-conversion filter that precedes said I polyphase filter and at least one second rate-conversion filter that precedes said Q polyphase filter to thereby reduce the rate of said data elements.

23. The modulator of claim 21, wherein said first and second rate-conversion filters are polyphase filters.

24. The modulator of claim 21, wherein said synthesizer includes:
- a phase accumulator that generates a primary substream of digital words;
- M−1 phase offset generators that offset said primary substream to thereby generate M−1 secondary substreams of digital words; and
- M phase-to-amplitude converters that convert respective digital words of said primary and secondary substreams to respective ones of said polyphase cosine elements and said polyphase sine elements.

25. The modulator of claim 21, wherein each of said quadrature modulators includes:
- an I multiplier that multiplies interpolated I elements and cosine elements;
- a Q multiplier that multiplies interpolated Q elements and sine elements; and
- a summer that sums products of said I and Q multipliers.

26. The modulator of claim 21, further including a multiplexer that sequentially selects said polyphase modulated elements to form a modulated digital signal $S_{mod_{dig}}$.

27. The modulator of claim 21, wherein M is 2.

28. A method of generating a modulated digital signal $S_{mod_{dig}}$ at a system rate $R_s$ from I and Q baseband symbols which map data elements of an input data stream to corresponding states in a modulation constellation, the method comprising the steps of:
- interpolating said I and Q baseband symbols into M interpolated I elements and M interpolated Q elements;
- synthesizing M polyphase cosine elements of a quantized cosine signal and M polyphase sine elements of a quantized sine signal;
- at a modulation rate $R_s/M$, modulating respective ones of said M polyphase cosine elements and said M polyphase sine elements with respective ones of said interpolated I elements and said interpolated Q elements to thereby form M polyphase modulated elements; and
- multiplexing said M polyphase modulated elements into said modulated digital signal $S_{mod_{dig}}$.

29. The method of claim 28, wherein said interpolating step includes the step of processing said I and Q baseband symbols with polyphase filters.

30. The modulator of claim 28, wherein M is 2.

* * * * *